(12) United States Patent
Agostini et al.

(10) Patent No.: US 7,791,885 B2
(45) Date of Patent: Sep. 7, 2010

(54) TWO-PHASE COOLING CIRCUIT

(75) Inventors: Bruno Agostini, Dietikon (CH); Berk Yesin, Zürich (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 12/466,036

(22) Filed: May 14, 2009

(65) Prior Publication Data

US 2009/0284926 A1  Nov. 19, 2009

(30) Foreign Application Priority Data

May 14, 2008  (EP) ................... 08103946

(51) Int. Cl.
*H05K 7/20* (2006.01)
(52) U.S. Cl. ............... 361/700; 361/699; 361/704; 165/80.4; 165/104.33
(58) Field of Classification Search ............ None
See application file for complete search history.

(56) References Cited

U.S. PATENT DOCUMENTS

| 4,314,601 | A | 2/1982 | Giuffre et al. |
| 5,054,296 | A | 10/1991 | Sotani et al. |
| 5,195,577 | A | 3/1993 | Kameda et al. |
| 5,199,387 | A | 4/1993 | Ap |
| 6,341,645 | B1 | 1/2002 | Tanaka et al. |
| 6,993,926 | B2 * | 2/2006 | Rini et al. ............. 62/259.2 |
| 6,994,151 | B2 * | 2/2006 | Zhou et al. ............. 165/80.4 |
| 7,201,215 | B2 * | 4/2007 | Ippoushi et al. ........ 165/104.24 |
| 7,204,298 | B2 * | 4/2007 | Hodes et al. ............. 165/80.4 |
| 7,450,386 | B2 * | 11/2008 | Silverstein et al. ........ 361/700 |
| 2001/0042614 | A1 | 11/2001 | Okamoto |

FOREIGN PATENT DOCUMENTS

| DE | 34 22 039 A1 | 12/1985 |
| DE | 42 31 845 A1 | 12/1993 |
| EP | 0 398 805 A1 | 11/1990 |
| EP | 0 657 633 A1 | 6/1995 |
| JP | 61-119997 A | 6/1986 |

OTHER PUBLICATIONS

European Search Report dated Oct. 28, 2008.

* cited by examiner

*Primary Examiner*—Boris L Chervinsky
(74) *Attorney, Agent, or Firm*—Buchanan Ingersoll & Rooney PC

(57) ABSTRACT

The disclosure relates to a two-phase cooling circuit. The cooling circuit can include an evaporator and a condenser. The evaporator and condenser can be connected by a feeder line and a first return line. A phase separator is arranged at an inlet side of the condenser. The phase separator can be connected with the evaporator by a second return line.

20 Claims, 2 Drawing Sheets

TWO-PHASE COOLING CIRCUIT

RELATED APPLICATION

This application claims priority under 35 U.S.C. §119 to European Patent Application No. 08102946.3 filed in Europe on May 14, 2008, the entire content of which is hereby incorporated by reference in its entirety.

TECHNICAL FIELD

The disclosure relates to a two-phase cooling circuit, such as a cooling circuit, for cooling at least one of a power electronic and a power electric device as well as to a power module comprising such a cooling circuit.

BACKGROUND INFORMATION

Power electronic devices can reach performances that can cause cooling problems due to dissipated heat. The power of such devices, for example switching elements or the like, has increased in recent years and consequently the emitted heat has also increased. Two-phase cooling circuits are efficient in cooling of such electronic devices. The liquid is heated by the emitted heat of the power devices to be cooled and in contact with the cooling circuit until the liquid reaches its boiling temperature. The temperature of the liquid during evaporation is constant and thereby limits the maximum temperature the device to be cooled can reach.

The cooling circuit itself can comprise an evaporator and a condenser connected thereto in a closed circuit. In the evaporator there is arranged the liquid reservoir which is in thermal contact with the heat emitting device. The cross section of the evaporator is large enough to constitute the liquid reservoir or pool. The heat of the device causes the liquid to boil and thus vapor is generated and conveyed from the evaporator to the condenser. Within the condenser the vapor is cooled down again to fall below the boiling temperature. As a consequence thereof another phase change occurs and the vapor condenses to become a liquid again. The liquid is afterwards fed back to the evaporator and is stored within the liquid reservoir again. A cooling circuit working in accordance with the above-mentioned principle is explained for example in U.S. Pat. No. 5,195,577, the disclosure of which is hereby incorporated by reference in its entirety.

In such cooling circuits, the evaporator can serve as a liquid reservoir as explained above. This is achieved by constructing an inner volume of the evaporator which serves as the liquid reservoir. This liquid reservoir can be brought into thermal contact with a heat emitting device. When heat is transferred to the liquid therefore pool boiling can occur. With such pool boiling, the heat transfer performance of such an evaporator can be relatively poor, the evaporator can be quite bulky, the cooling circuit involves a large fluid inventory, and the cooling circuit can be difficult to make leak proof at high pressure conditions.

Attempts to address known drawbacks have included reducing the diameter of the evaporator by, for example, constituting the evaporator with a number of tube-like channels with a small diameter. When the diameter of these channels is below a critical value which is defined by the type of liquid used, the operation changes from "pool boiling" to "convection boiling" or "flow boiling". When flow boiling or convection boiling occurs, a mixture of a gas phase or a vapor phase and a liquid phase is given at the exit side of the evaporator. Such convection boiling can improve the performance of an evaporator. But on the other hand such convection boiling can have the disadvantage that the performance of the condenser is affected in a negative way if it is fed with a mixture of a gas phase and a liquid phase. Thus, in order not to lose overall performance of the cooling circuit, it can be desirable to provide a pure vapor phase to the condenser.

SUMMARY

A two-phase cooling circuit is disclosed which comprises an evaporator, and a condenser connected with the evaporator by a feeder line and by a first return line, the feeder line fluidly connecting an upper end of said evaporator with an inlet side of the condenser, and the first return line fluidly connecting a lower end of the condenser with a lower end of the evaporator, wherein the cooling circuit is a closed loop cooling circuit when in operation, and wherein the evaporator allows at least partially for convection boiling, and wherein said evaporator is configured for thermal connection to a heat emitting device, and wherein the lower end of the condenser is arranged at least at a first height level where the upper end of said evaporator is located, and wherein a phase separation means is arranged in the feeder line at an inlet side of said condenser, wherein said phase separation means is fluidly connected to the evaporator by a second return line.

BRIEF DESCRIPTION OF THE DRAWINGS

Other advantages will be explained by reference to the Figures and the following detailed description.

DETAILED DESCRIPTION

Figure 1:
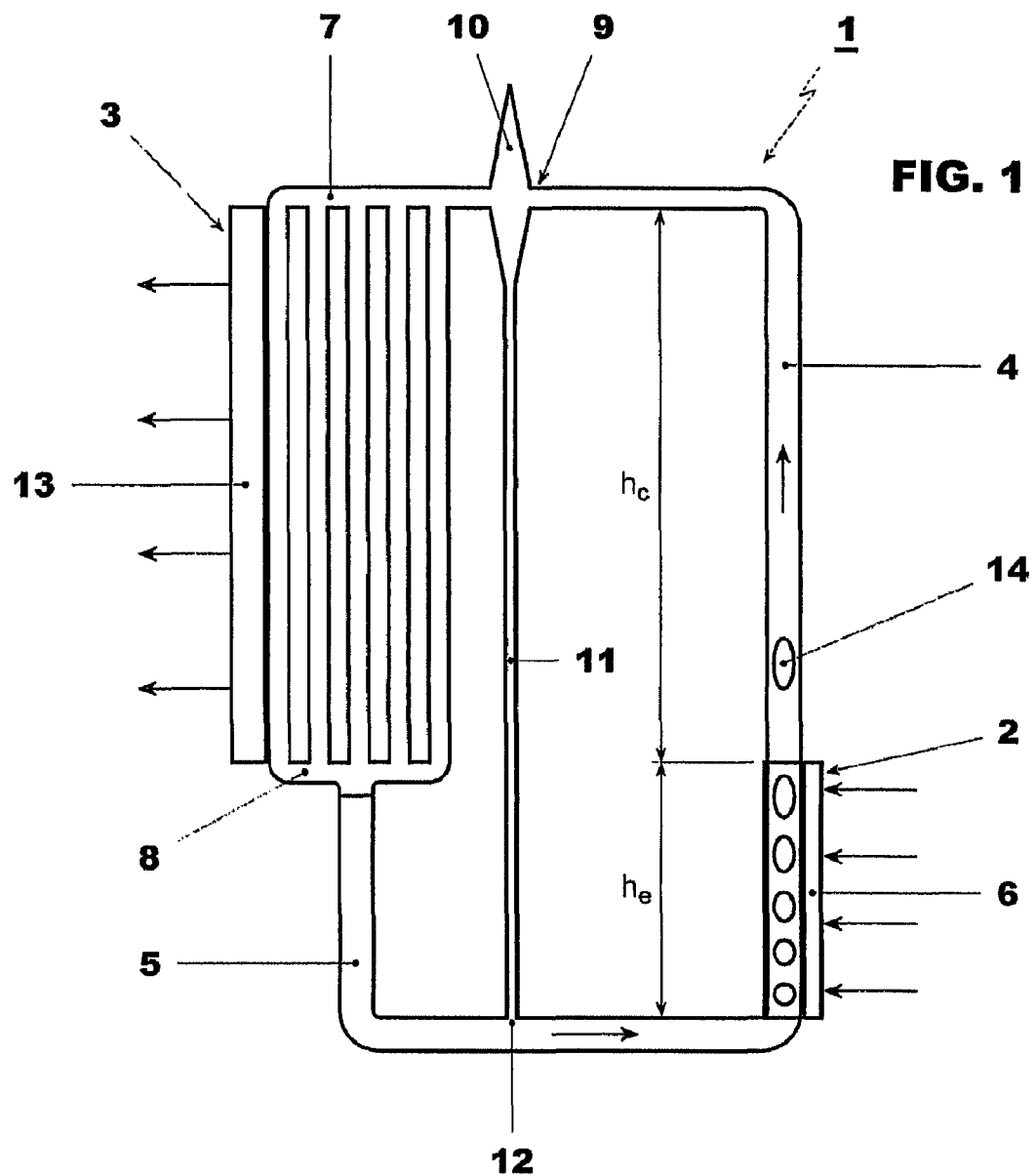
FIG. 1 shows a first schematic illustration of a cooling circuit according to an exemplary embodiment with a phase-separation means located directly at the inlet side of the condenser.

Exemplary embodiments disclosed herein can improve the overall performance of a two-phase cooling circuit.

A two-phase cooling circuit is disclosed comprising an evaporator, and a condenser connected with the evaporator. A power module is also disclosed comprising at least one such a cooling circuit.

The term power module is understood hereinafter as an assembly comprising at least one power electronic and/or power electric device that is thermally connected to at least one cooling circuit according to the present disclosure. Moreover, the terms power electronic and/or power electric device and heat emitting device are used in an interchangeable manner hereinafter.

The evaporator and the condenser of an exemplary cooling circuit disclosed herein are fluidly connected by a feeder line and a first return line. According to an exemplary embodiment, a phase-separation means is arranged at an inlet side of the condenser. The phase-separation means is connected by a second return line to the evaporator.

According to a first exemplary aspect of the present disclosure, the two-phase cooling circuit comprises an evaporator and a condenser which are connected to one another in a closed loop by a feeder line and by a first return line. For example, the feeder line is fluidly connecting an upper end of said evaporator with an inlet side of the condenser, whereas the first return line fluidly connects a lower end of the condenser with a lower end of the evaporator. In operation, the evaporator allows at least partially for convection boiling. The evaporator is thermally connectable to at least heat emitting device. The lower end of the condenser is arranged at least at a first height level where the upper end of said evaporator (2) is located. A phase separation means is arranged in the feeder line at an inlet side of said condenser and fluidly connected to the evaporator by a second return line.

According to the disclosure the liquid phase entrained in the vapor stream is separated from the vapor phase before the mixture is applied to the condenser. By separating the vapor phase and the liquid phase to a large extent it is possible to feed an almost pure vapor phase to the condenser thereby keeping its performance at a high level. On the other hand it is possible to use convection boiling thereby increasing the performance of the evaporator. The term almost pure vapor phase is understood to be a vapor phase comprising at least 70 mass-percents of vapor. The phase-separation means is arranged at the inlet side close by the condenser in order not to deteriorate the performance of the evaporator. This could happen if for example the separation means would be located directly at the exit of the evaporator. But according to the disclosure, the mixture of the vapor phase and the liquid phase can be transferred to the region of the inlet of the condenser after exiting the evaporator first. At this point, the vapor is fed to a phase-separation means before the almost pure vapor phase is then condensed without affecting the performance of the evaporator excessively.

According to a first exemplary embodiment, the lower end of the condenser is arranged approximately at least at the same height as an upper end of said evaporator. The phase-separation means is then located approximately in the same height as the inlet port of the condenser. In other words, the phase separation means is located at least at a second height level where the inlet of the condenser is located. By this arrangement, the gravition driven cooling circuit works without any need of additional pumps (i.e, is pumpless) in order to feed back liquid exiting from the condenser, and the distance between the phase-separation means and the evaporator can be large enough so that the evaporator can work with an optimum performance. As referenced herein, "optimum performance" refers to keeping a distance between the phase-separation means and the evaporator by adapting the evaporator with respect to shape and channel size considering only the heat transfer and evaporization performance of the evaporator. Pumpless cooling circuits can be considered advantageous in terns of overall efficiency in that they do not rely on external energy for driving pumps.

Where desired, the second return line short-circuits the feeder line connecting the exit of the evaporator with an input side of the condenser and the first return line connecting the exit of the condenser with the inlet side of the evaporator. The liquid phase part of the mixture exiting from the evaporator is fed back in a very easy way to the liquid phase generated inside said condenser. Short circuiting the feeder line and the first return line permits using, on the one hand, a condenser which is unchanged, and on the other hand, an evaporator which is unchanged. This makes it easy to, for example, improve the overall performance of such a cooling circuit without the need of a new design of evaporatsor and condenser.

In an exemplary embodiment of the cooling circuit, the phase separation means is located in the feeder line thereby dividing the feeder line into a first part connecting said evaporator with said phase-separation means and a second part connecting said evaporator with said condenser, whereby that first part is longer than said second part. This is in accordance with advantages of the phase-separation means as described above. The distance between the phase-separation means and the condenser can be shorter than the distance between the evaporator and the phase-separation means. This can ensure that there is no negative effect of the phase-separation means with respect to the performance of the evaporator. At the same time it is possible to insert the phase-separation means at some point into the feeder line, where, for example, requirements prevent the phase-separation means from being included for example into the condenser or the manifold of a condenser at the inlet side.

On the other hand, there are exemplary embodiments of the cooling circuit where the phase-separation means is at least partially integrated in the condenser by arranging it directly at the inlet port of the condenser. Depending on the embodiment, the phase-separation means is fully or at least partly integrated in the condenser integration or in its inlet port, respectively. Depending on the embodiment of the second return line, it can have a length that equals the sum of the condenser height and the evaporator height or extends essentially (i.e., approximately, such as plus or minus 10%) between the lower end of the evaporator and the inlet of the condenser. Depending on the requirements, an at least partial integration of the separation means into the manifold of the condenser can be advantageous because it contributes to a maximum distance between the evaporator and the phase-separation means.

It can prove advantageous to the thermal efficiency of the disclosed cooling circuit if the phase separation means has an optimized (e.g., reduced, or negligible) flow resistance. A low pressure drop of the vaporized working fluid caused by the phase separation means in operation can be desirable as it does not deprive the thermal efficiency of the two phase cooling circuit excessively.

An exemplary embodiment of the phase separation means comprises at least one flow deflection means that is arranged such that a vaporized working fluid is deflected when in operation. This deflection can advantageously support the gravity effect on condensated vapor towards its evaporator side when seen in a direction of flow emerging of the evaporator, such that droplets of working fluid are led into the return line. In particular, the at least one flow deflection means can be arranged such that a vaporized working fluid is deflected in a direction extending transversely to a flow direction in the feeder line proximate to the phase separation means (e.g., deflected in a general direction of the lower end of the condenser).

Good vapor separation values can be achievable if the phase separation means is, for example, a capillary phase separator.

The advantages referred to above with respect to the disclosed two-phase cooling circuit do in general apply analogously for the power module disclosed below. Likewise the advantages referred to in regard to the power module can apply for the disclosed two-phase cooling circuit, too.

In another aspect of the present disclosure, a power module is disclosed comprising at least one heat emitting device, such as a power electronic and/or electric device that is thermally connected to at least one two-phase cooling circuit as disclosed herein.

Referring to FIG. 1, an exemplary two-phase cooling circuit 1 comprises an evaporator 2 and a condenser 3. Evaporator 2 is connected via feeder line 4 to condenser 3. Feeder line 4 transfers said vapor phase/liquid phase mixture exiting evaporator 2 when heat is transferred to the evaporator 2 to the condenser 3.

After cooling down the vapor phase, thereby condensing the vapor again to the liquid phase, the liquid is returned to the evaporator 2 by use of a first return line 5. First return line 5 connects the exit port of the condenser 3 with the inlet side of evaporator 2.

Evaporator 2 is configured to be in thermal contact (e.g., by one wall 6 of evaporator 2) with the heat emitting device. The heat emitting device which is especially considered when constructing the shown cooling circuit 1 is for example a power electronic device. Evaporator 2 has a height $h_e$ extending in a vertical direction. The orientation of an evaporator 2 is automatically given by the direction of gravity as the vapor phase will go up in a vertical direction. Condenser 3 has a height $h_c$ and is arranged in such a way that the lower end of the condenser 3 with its outlet port approximately is at least equal with the upper end of evaporator 2.

Condenser 3 comprises at its inlet side a manifold 7 thereby dividing the feeder line 4 connected to an inlet port 9 into separate channels (e.g., for improved condensation). The separate channels are connected with a heat exchange means 13 which is shown schematically in FIG. 1. The condensed vapor is then summed up by a collection drain 8 which at the same time provides an outlet port of condenser 3. This outlet port is connected to the first return line 5.

Figure 2:
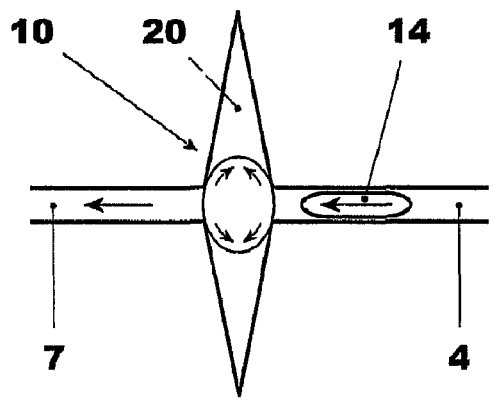
FIG. 2 shows an exemplary of a phase-separation means using capillary forces of the liquid phase of the mixture.

At the inlet side of said condenser 3 (e.g., especially at the inlet port 9), a phase-separation means 10 is arranged. In the first embodiment as shown in FIG. 1, this phase-separation means 10 is an integrated part of the condenser 3. It can be especially integrated into the manifold 7 so to be positioned at the entrance of the vapor/liquid mixture coming from evaporator 2. The particular way the phase-separation means 10 works can be of any known manner and details need not be disclosed herein. One possibility in order to separate the liquid phase from the vapor phase is the use of a capillary phase separator which is shown more detailed in FIG. 2. The phase separator as shown in FIG. 2 is inserted between the connecting point of feeder line 4 and manifold 7. It comprises a separation volume 20 which extends in a lateral direction with respect to the feeder line 4 to which it is connected. The separation volume 20 has a tapered shape thereby using the capillary forces for separation of the liquid from the vapor phase. The vapor phase is provided in form of bubbles 14 causing liquid by frictional forces to flow as well in direction of the condenser 3 according to the small diameter of the feeder line 4 and the channels of evaporator 2.

Referring to FIG. 1, it is shown that the phase-separation means 10 is connected by a second return line 11 to the first return line 5. The second return line 11 ends at a connection point where it supplies the liquid originating from the vapor/liquid-mixture of the feeder line 4.

Figure 3:
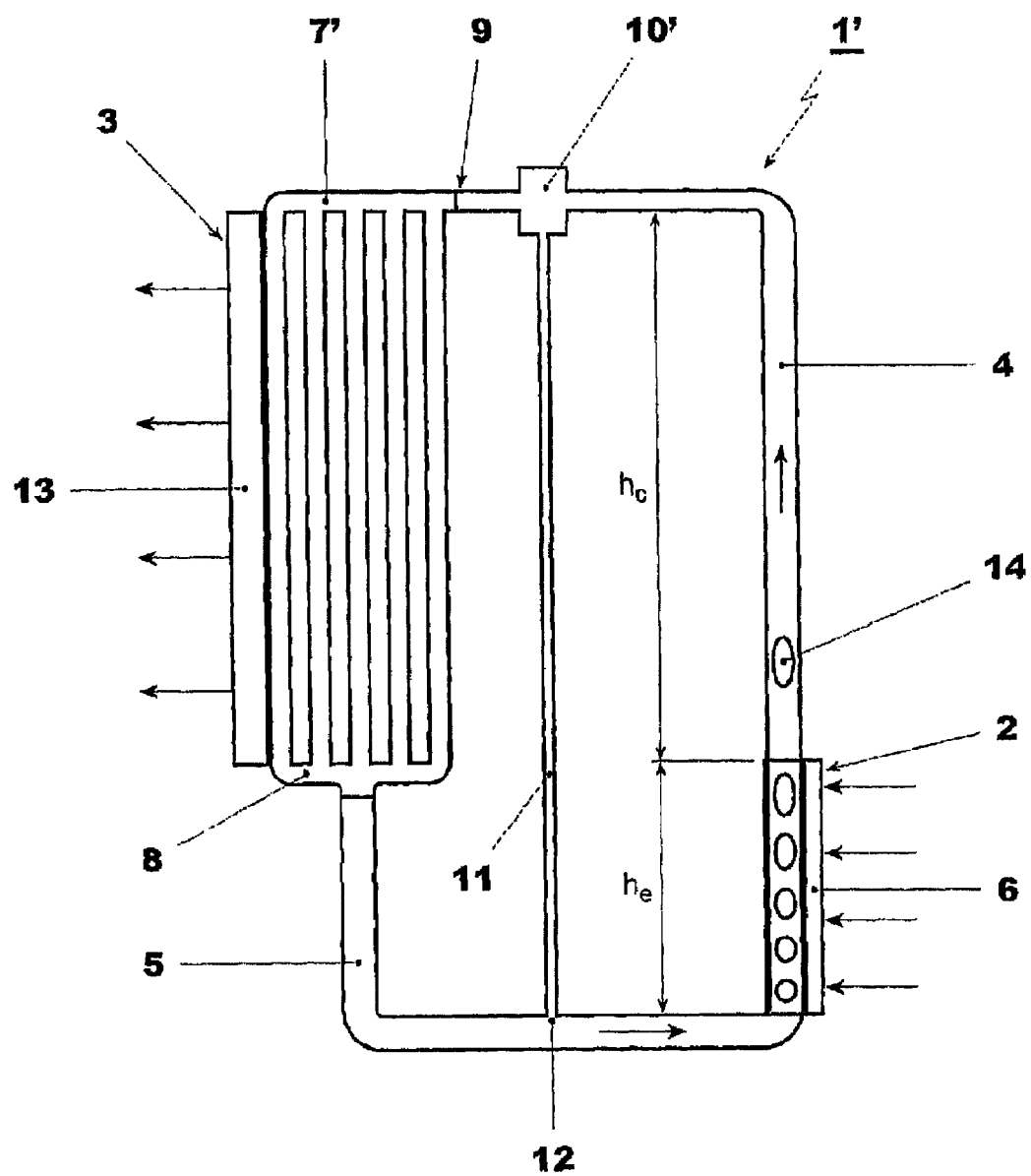
FIG. 3 shows a second example in a schematic illustration where the phase-separation means is located in the feeder line.

FIG. 3 shows a further exemplary embodiment of a cooling circuit according to the present disclosure. Similar elements and features as already explained with respect to FIG. 1 are denoted with the same reference numerals. In order to avoid unnecessary repetition thereof a further explanation will be omitted.

Contrary to the exemplary embodiment of FIG. 1, it is shown in FIG. 3 that the phase-separation means 10' is located separately from condenser 3. Nevertheless it is still near the inlet port 9 of condenser 3, in particular nearer to the inlet port 9 than to the evaporator 2. The arrangement with a separate phase-separation means allows the use of a known condenser 3 without the need of a new design (although a new, dedicated design can be used). Phase-separation means 10' is arranged in feeder line 4 thereby dividing feeder line 4 into a first part connecting evaporator 2 to the phase-separation means 10', and a second part connecting phase-separation means 10' with the inlet port 9 of condenser 3. Apart from the non-integrated design of the phase-separation means 10', the functionality of both cooling circuits 1 and 1' can be the same. The phase separation means 10 or 10' can be located near the inlet side of the condenser 3, which means that a distance between the exit of evaporator 2 and the phase separation means 10 or 10' can be defined as large as possible. It is further worth mentioning that the diameter for example of the second return line 11 can be relatively narrow for example about 1 mm. This is sufficient in order to feed back the liquid separated from the vapor phase in which it was entrained. In both embodiments the length of the second return line equals the sum of evaporator's height $h_e$ and condenser height $h_c$.

The present disclosure is not limited to the shown exemplary embodiments. In particular, it is possible to combine features of any of the embodiments with other features in an advantageous way.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. Two-phase cooling circuit comprising:
an evaporator; and
a condenser connected with the evaporator by a feeder line and by a first return line, the feeder line fluidly connecting an upper end of said evaporator with an inlet side of the condenser, and the first return line fluidly connecting a lower end of the condenser with a lower end of the evaporator,
wherein the cooling circuit is a closed loop cooling circuit when in operation, and wherein the evaporator allows at least partially for convection boiling,
and wherein said evaporator is configured for thermal connection to a heat emitting device, and wherein the lower end of the condenser is arranged at least at a first height level where the upper end of said evaporator is located, and wherein a phase separation means is arranged in the feeder line at an inlet side of said condenser, wherein said phase separation means is fluidly connected to the evaporator by a second return line.

2. Two-phase cooling circuit according to claim 1, wherein the cooling circuit is gravitation driven when in operation.

3. Two-phase cooling circuit according to claim 1, wherein the cooling circuit is pumpless.

4. Two-phase cooling circuit according to claim 1, wherein the phase separation means is located at least at a second height level where the inlet of the condenser is located.

5. Two-phase cooling circuit according to claim 1, wherein said second return line short circuits said feeder line and said first return line.

6. Two-phase cooling circuit according to claim 1, wherein the phase separation means is located in said feeder line thereby dividing the feeder line into a first part connecting said evaporator with said phase separation means and a second part connecting said phase separation means with said condenser whereby said first part is longer than said second part.

7. Two-phase cooling circuit according to claim 1, wherein the phase separation means is arranged directly at an inlet port of said condenser and wherein said second return line extends essentially between the lower end of the evaporator and the inlet of the condenser.

8. Two phase cooling circuit according to claim 1, wherein said phase separation means is at least partially integrated in a manifold that comprises the inlet port of said condenser.

9. Two phase cooling circuit according to claim 1, wherein said phase separation means is configured to reduce flow resistance.

10. Two phase cooling circuit according to claim 1, wherein
said phase separation means comprises at least one flow deflection means that is arranged such that a vaporized working fluid is deflected when in operation.

11. Two phase cooling circuit according to claim 10, wherein
the at least one flow deflection means is arranged such that a vaporized working fluid is deflected in a direction extending transversely to a flow direction in the feeder line proximate to the phase separation means, and in a direction of the lower end of the condenser.

12. Two phase cooling circuit according to claim 1, wherein
said phase separation means is a capillary phase separator.

13. Two-phase cooling circuit according to claim 3, wherein
the phase separation means is located at least at a second height level where the inlet of the condenser is located.

14. Two-phase cooling circuit according to claim 13, wherein
said second return line short circuits said feeder line and said first return line.

15. Two-phase cooling circuit according to claim 4, wherein
the phase separation means is located in said feeder line thereby dividing the feeder line into a first part connecting said evaporator with said phase separation means and a second part connecting said phase separation means with said condenser whereby said first part is longer than said second part.

16. Two-phase cooling circuit according to claim 15, wherein
the phase separation means is arranged directly at an inlet port of said condenser and wherein said second return line extends essentially between the lower end of the evaporator and the inlet of the condenser.

17. Two phase cooling circuit according to claim 16, wherein
said phase separation means is at least partially integrated in a manifold that comprises the inlet port of said condenser.

18. Two phase cooling circuit according to claim 4, wherein
said phase separation means comprises at least one flow deflection means that is arranged such that a vaporized working fluid is deflected when in operation, said phase separation means being a capillary phase separator.

19. Power module comprising at least one heat emitting device that is thermally connected to an evaporator of at least one cooling circuit configured according to claim 1.

20. Power module according to claim 19, wherein the at least one heat emitting device comprises at least one of a power electronic device and a power electronic device.

* * * * *